United States Patent

Besser et al.

[11] Patent Number: 6,110,829
[45] Date of Patent: Aug. 29, 2000

[54] ULTRA-LOW TEMPERATURE AL FILL FOR SUB-0.25 μM GENERATION OF ICS USING AN AL-GE-CU ALLOY

[75] Inventors: Paul Raymond Besser; Robin W. Cheung, both of Cupertino; Guarionex Morales, Santa Clara, all of Calif.

[73] Assignee: Advanced Micro Devices, Inc., Sunnyvale, Calif.

[21] Appl. No.: 08/956,343

[22] Filed: Oct. 23, 1997

[51] Int. Cl.$^7$ ................................................... H01L 21/44
[52] U.S. Cl. .................... 438/688; 420/528; 420/529; 420/903; 148/502; 148/505; 148/535; 148/438; 148/DIG. 58
[58] Field of Search ............................ 438/688; 420/528, 420/529, 903; 148/502, 505, 535, 438, DIG. 58

[56] References Cited

U.S. PATENT DOCUMENTS 5,691,571  11/1997  Hirose et al. ............................ 257/751

OTHER PUBLICATIONS

Kuniko Kikuta, Yoshihiro Hayashi, Tutomu Nakajima, Keiichi Harashima, and Takamaro Kikkawa, "Aluminum–Germanium–Copper Multilevel Damascene Process Using Low–Temperature Reflow Sputtering and Chemical Mechanical Polishing," Transactions On Electron Devices, vol. 43, No. 5, May 1996.

K. Kikuta and T. Kikkawa, "Electromigration Charactistics for Al–Ge–Cu" J. Electrochem. Soc. vol. 143, No. 3, Mar. 1996.

K. Kikuta, T. Kikkawa and H. Aoki, "0.25 μm Contact Hole Filling By Al–Ge Reflow Sputtering," Microelectronic Research Laboratories, NEC Corporation.

K. Kikuta and t. Kikkawa, "Al–Ge Reflow Sputtering for Submicron Contact Hole Filling," J. Electrochem. Soc. vol. 143, No. 1, Jan. 1996.

K. Kikuta, Y. Hayashi, T. Nakajima, K. Harashima and T. Kikkawa, Aluminum–Germanium–Copper Multilevel Damascene Process using Low Temperature Reflow Sputtering and Chemical Mechanical Polishing, IEDM 94–101, 1994 IEEE.

*Primary Examiner*—Richard Booth
*Assistant Examiner*—David A. Zarneke
*Attorney, Agent, or Firm*—H. Donald Nelson

[57] ABSTRACT

An aluminum fill process for sub-0.25 μm technology integrated circuits that has a reflow temperature less than 400° C. that has low alloy resistivity and excellent electromigration characteristics. The aluminum allow is composed of Al-1% Ge-1% Cu.

3 Claims, 2 Drawing Sheets

ULTRA-LOW TEMPERATURE AL FILL FOR SUB-0.25 µM GENERATION OF ICS USING AN AL-GE-CU ALLOY

BACKGROUND OF THE INVENTION

1. Field of the Invention

This invention relates generally to a process for depositing aluminum alloys into vias and trenches in semiconductor devices and more specifically, this invention relates to a low temperature process for depositing an aluminum alloy into sub-0.25 µm vias and trenches. Even more specifically, this invention relates to process for depositing an aluminum alloy into sub-0.25 µm vias and trenches with an Al—Ge—Cu alloy that has a reflow temperature less than 400° C. and has excellent electromigration characteristics.

2. Discussion of the Related Art

The semiconductor industry is characterized by the ongoing requirement to increase the device integration in a semiconductor chip. This means that the packing density of the devices on a semiconductor chip has to be increased. To achieve increased packing density on a semiconductor chip, the device dimensions have to be decreased. Presently, there is an intense effort to reliably decrease the device dimensions below the sub-0.25 µm dimension. A major part of this effort is concentrated in the area of improving the technology relating to contact hole or via filling, trench filling and the associated planarization technology. These areas of technology must be improved in order to achieve device reliability. As an example of the products that use such device dimensions, the 256 Mbit dynamic random access memory have contact holes which are 0.25 µm in diameter and have an aspect ratio of 4. Conventional sputtering has proven unreliable in handling such a high aspect ratio because of its poor step coverage. Solutions involving blanket low pressure chemical vapor deposition (LPCVD) tungsten and selective LPCVD tungsten have been proposed and contact holes with 0.2 µm diameter and an aspect ration of 3 have been successfully filled. However, tungsten has high resistance, high film stress, and is difficult to process.

Aluminum (Al) has a lower resistivity and a lower film stress than tungsten. Kuniko Kikuta and Takamaro Kikkawa, in an article entitled "Al—Ge Reflow Sputtering for Submicron Contact Hole Filling," Journal of the Electrochemical Society, Vol. 143, No. 1, January 1996, state that some researchers have attempted to overcome the problem of poor step coverage for conventional sputtering by using aluminum reflow technology, some applying it with laser irradiation and some with high substrate heating over 500° C. However, the high temperature at which conventional Al alloys flow degrades the reliability of underlying metallization because of thermal stress-induced void formation. In this paper, Kikuta and Kikkawa proposed an aluminum-germanium alloy, Al—5% Ge reflow sputtering for submicron contact hole filling. Although Kikuta and Kikkawa obtained a substantial reduction of the reflow temperature to approximately 300° C., the resistance of the Al alloy increased to an unacceptable level.

In a later paper, Kuniko Kikuta, Yoshihiro Hayashi, Tutomu Nakajima, Keiichi Harashima and Takamaro Kikkawa, in an article entitled "Aluminum-Germanium-Copper Multilevel Damascene Process Using Low-Temperature Reflow Sputtering and Chemical Mechanical Polishing," IEEE Transactions On Electron Devices, Vol. 43, No. 5, May 1996, describe a low-temperature multilevel aluminum-germanium-copper damascene technology that was developed using reflow sputtering and chemical mechanical polishing. The described process reduced the maximum processing temperature for the fabrication of multilevel interconnections to approximately 420° C. using an Al-1% Ge-0.5% Cu. In a paper entitled "Electromigration Characteristics for Al—Ge—Cu," Journal of Electrochemical Soc. Vol. 143, No. 3, March 1996, Kikuta and Kikkawa describe their investigation of the electromigration characteristics of the Al—Ge—Cu alloy. They indicate that the use of an Al-5% Ge alloy achieved a low temperature reflow sputtering down to approximately 300° C., but as described above, the high percentage of germanium increased the resistivity of the aluminum alloy to an unacceptable level. They conclude that an alloy of Al-1% Ge-0.5% Cu is suitable for reflow sputtering since the reflow temperature is approximately 400° C.

However, because the process to manufacture a sub-0.25 µm technology product that uses low-k dielectrics must have a maximum temperature below 400° C. the processes and alloys described by the above articles do not meet the needs of the advancing semiconductor industry.

Therefore, what is needed is an aluminum alloy that has a reflow temperature less than 400° C., has improved electromigration characteristics and has low resistivity.

SUMMARY OF THE INVENTION

An aluminum fill process in accordance with the present invention solves the above and other problems associated with the present aluminum fill process for sub-0.25 µm technology integrated circuits. The aluminum fill process in accordance with the present invention utilizes an aluminum alloy Al-1% Ge-1% Cu that provides a reflow temperature less than 400° C., has low resistivity and improved electromigration characteristics. The 1% Cu concentration in the alloy provides an unexpected result of not only improving the electromigration characteristics of the alloy but further reduces the reflow temperature.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention that illustrate the best mode presently contemplated by the inventors for practicing the invention. In each figure, like numerals denote like elements shown in a previous figure.

Figure 1A:
FIG. 1A illustrates a starting point for the present invention in a manufacturing process for an integrated circuit and shows a semiconductor substrate that would have semiconductor devices formed therein.

FIG. 1A shows a substrate 100 in which semiconductor devices have been formed and which are not shown. The formation of such semiconductor devices is well known in the semiconductor manufacturing art and will not be further discussed.

Figure 1B:
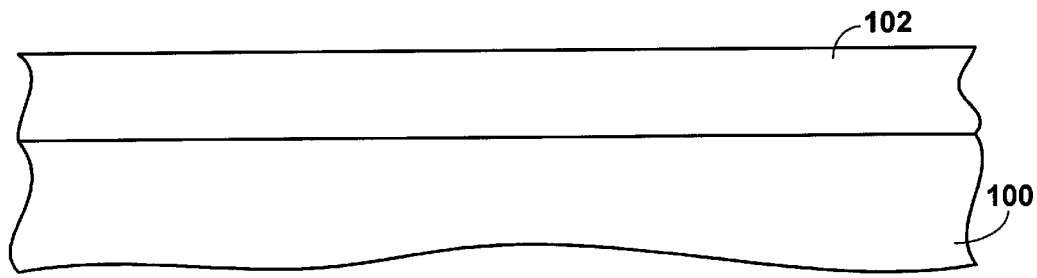
FIG. 1B shows an interlayer dielectric formed on the device shown in FIG. 1A.

FIG. 1B shows a layer of a dielectric material 102 formed on the substrate 100. The dielectric material 102 could be the first interlayer dielectric (ILD1) and typically has a thickness of about 1 $\mu$m. A method of forming the dielectric material 102 is by deposition on the substrate 100 by PECVD $SiO_2$ with Tetraethylorthosilicate (TEOS) and Oxygen ($O_2$). This dielectric could be a low-k dielectric material. The surface of the dielectric material is typically planarized by chemical mechanical polishing (CMP).

Figure 1C:
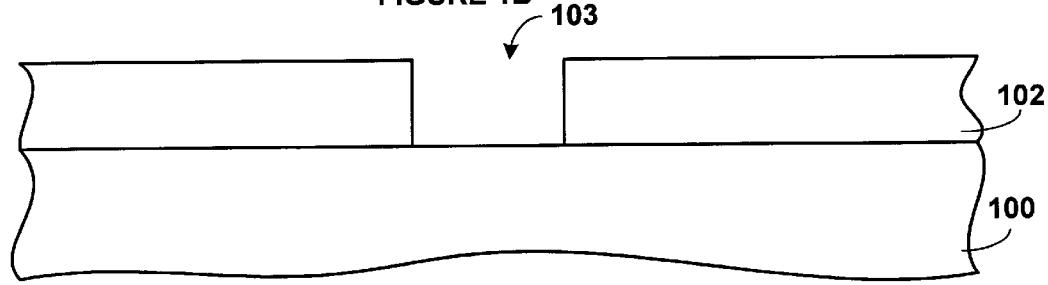
FIG. 1C shows a via or trench etched in the device shown in FIG. 1B.

FIG. 1C shows a via or trench 103 etched into the dielectric material 102. As can be appreciated, the figures show a cross section of the device and the structure shown etched into the dielectric material 102 in FIG. 1C can be either a via or a trench. The via or trench 103 is etched using well known methods such as forming a patterned photoresist layer on the dielectric material 102 and then etching the 103. One method of etching the dielectric material 102 is by ion etching (RIE) using $CHF_3$ and CO.

Figure 1D:
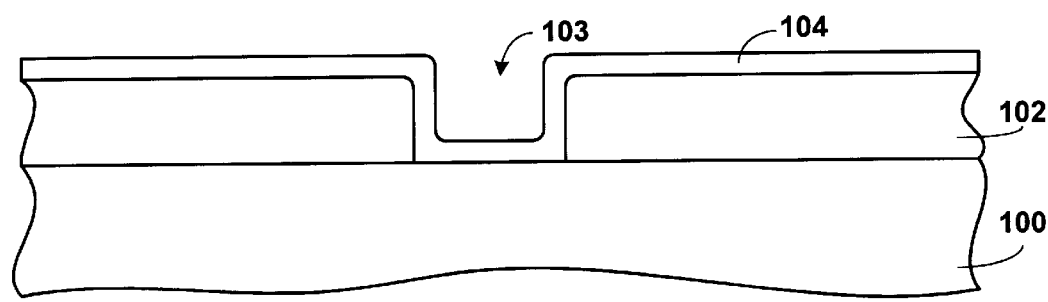
FIG. 1D shows a liner material formed on the surfaces of the device including the surfaces of the via or trench shown formed in FIG. 1C.

FIG. 1D shows a barrier layer 104 formed on the surface of the dielectric material 102. The bottoms of the trenches can be cleaned by RF Ar etching before the barrier layer 104 is formed. A Ti liner is deposited on the surface of the dielectric material 102 and on the surfaces of the via or trench 103. The Ti liner can be deposited on the surface of the trenches in the dielectric material by various processes including direct current magnetron sputtering, CVD techniques, and ionized metal plasma technologies. The titanium liner is typically used as a diffusion barrier. Ti is an oxygen-gettering material and oxide-reducing agent, which causes it to dissolve the native oxide layer on the Si surface during annealing and to adhere well to both Si and $SiO_2$. A layer of TiN can be formed on the Ti liner layer and is used as a contact diffusion barrier layer because it behaves as an impermeable barrier to silicon and because the activation energy for the diffusion of other impurities is high, for example, the activation energy for copper diffusion into TiN thin films is 4.3 eV, whereas the normal value for diffusion of copper into metals is only 1 to 2 eV. The TiN layer can be formed in one of five ways: by evaporating the Ti in an $N_2$ ambient; by reactively sputtering the TiN in an $Ar+N_2$; by sputtering from a TiN target in an inert (Ar) ambient; by sputter depositing Ti in an Ar ambient and converting it to TiN in a spearate plasma nitridation step; or by CVD.

Figure 2:
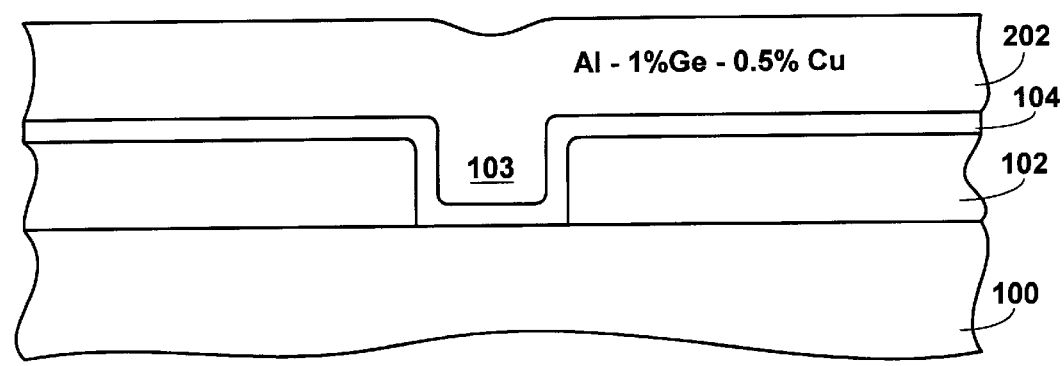
FIG. 2 illustrates a prior art process that would continue from the process shown in FIG. 1D.

FIG. 2 illustrates the next step in a process that would produce a prior art device 200. A layer of an aluminum alloy, Al-1% Ge-0.5% Cu 202 is deposited on the barrier layer 104. The aluminum alloy is deposited with a thickness of approximately 0.5 $\mu$m and can be deposited using the same sputtering system used to deposit the Ti. After the aluminum alloy is deposited, it is annealed (reflowed) at a temperature of 380° C. to 420° C.

Figure 3:
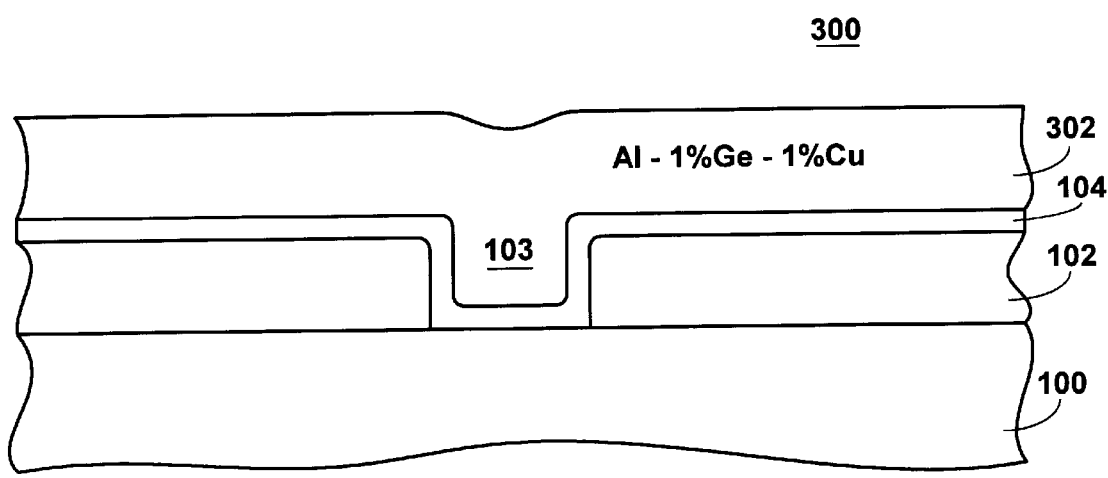
FIG. 3 illustrates the process of the present invention that would continue from the process shown in FIG. 1D.

FIG. 3 illustrates the next step in a process that would produce a device 300 in accordance with the present invention. A layer of aluminum alloy, Al-1% Ge-1% Cu Cu 302 is deposited on the barrier layer 104. The aluminum alloy is deposited with a thickness of approximately 0.5 $\mu$m and can be deposited using the same sputtering system used to deposit the Ti. After the aluminum alloy is deposited, it is annealed (reflowed) at a temperature of 380° C. to 420° C. The aluminum alloy deposited with a 1% concentration of copper exhibited the unexpected result that 1% concentration of copper not only improved the electromigration characteristics but also further reduced the reflow temperature to less than 400° C. This is a critical aspect of a 0.25 $\mu$m technology that utilized low dielectric constant dielectrics because the maximum temperature must be less than 400° C.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An ultra-low temperature aluminum fill process for sub-0.25 $\mu$m technology integrated circuits, the process comprising:

forming an interlayer dielectric on a surface of a semiconductor substrate in which semiconductor devices have been formed;

etching at least one trench or via in the interlayer dielectric;

forming a liner layer on the surface of the semiconductor substrate including side and bottom surfaces of the at least one trench or via; and forming a layer of an aluminum alloy on the surface of the semiconductor substrate wherein the layer of aluminum alloy fills the at least one trench or via and wherein the aluminum alloy is composed of aluminum, 1% germanium, and 1%±0.1% copper.

2. The ultra-low temperature aluminum fill process for sub-0.25 $\mu$m technology integrated circuits of claim 1 wherein the aluminum alloy is composed of aluminum, 1% germanium and 1% copper.

3. The ultra-low temperature aluminum fill process for sub-0.25 $\mu$m technology integrated circuits of claim 2 wherein the temperature of the aluminum fill process is less than 400° C.

* * * * *